United States Patent [19]
Lee et al.

[11] Patent Number: 5,781,491
[45] Date of Patent: Jul. 14, 1998

[54] MEMORY DEVICE HAVING DIVIDED CELL ARRAY BLOCKS TO WHICH DIFFERENT VOLTAGE LEVELS ARE APPLIED

[75] Inventors: Joo Sock Lee; Nho Kyung Park, both of Kyoungki-Do; Kyun Hyon Tchah, Seoul; Dong Min Lee, Kyoungki-Do, all of Rep. of Korea

[73] Assignee: Hyundai Electronics Industries Co., Ltd., Kyoungkido, Rep. of Korea

[21] Appl. No.: 835,621

[22] Filed: Apr. 9, 1997

[30] Foreign Application Priority Data

Apr. 10, 1996 [KR] Rep. of Korea ............... 1996-10844

[51] Int. Cl.$^6$ .................................................. G11C 5/14
[52] U.S. Cl. ............... 365/227; 365/230.03; 395/750.03
[58] Field of Search ........................... 365/227, 226, 365/230.03, 203; 395/750.03, 750.01

[56] References Cited

U.S. PATENT DOCUMENTS

| | | | |
|---|---|---|---|
| 4,881,205 | 11/1989 | Aihara | 365/227 |
| 4,916,668 | 4/1990 | Matsui | 365/230.01 |
| 5,452,256 | 9/1995 | Ichikawa | 365/227 |
| 5,687,382 | 11/1997 | Kojima et al. | 365/227 |

*Primary Examiner*—Tan T. Nguyen
*Attorney, Agent, or Firm*—Jacobson, Price, Holman & Stern, PLLC

[57] ABSTRACT

Disclosed is a semiconductor memory device capable of reducing power consumption. The semiconductor memory device according to the present invention divides a memory cell array into at least one cell array blocks and applies different voltage levels to the cell array blocks through a voltage divider. Accordingly, a voltage difference between a supply voltage level of each of the cell array blocks and a ground voltage level of each of the cell array blocks is (1/N)* Vdd voltage.

6 Claims, 6 Drawing Sheets

MEMORY DEVICE HAVING DIVIDED CELL ARRAY BLOCKS TO WHICH DIFFERENT VOLTAGE LEVELS ARE APPLIED

BACKGROUND OF THE INVENTION

1. Field of the Invention

The present invention relates to a semiconductor memory device, and more particularly to a semiconductor memory device having a power supply capable of reducing power consumption.

2. Description of the Prior Arts

In general, a static RAM, which is one of random access memories, includes a flip-flop and two inverters cross coupled. This SRAM is shown in the U.S. Pat. No. 4,916, 668 entitled "Internal Synchronization Type MOS SRAM With Address Transition Detecting Circuit".

FIG. 1 is a block diagram illustrating the configuration of the conventional SRAM, in which there are shown a memory cell MC1, high-resistance load devices R1 and R2, N-channel transfer MOS transistors Q1 and Q2, and N-channel driving MOS transistors Q3 and Q4.

The high-resistance load devices R1 and R2 are respectively coupled to a power supply and the drain terminals of the MOS transistors Q3 and Q4, and the source terminals of the transistors Q3 and Q4 are coupled to the ground voltage level, respectively. The gate terminal of the MOS transistor Q3 is coupled to node N2 at which the high-resistance load device R2 is coupled to the MOS transistor Q4. Similarly, the gate terminal of the MOS transistor Q4 is coupled to node N1 at which the high-resistance load device R1 is coupled to the MOS transistor Q3. The current path of the MOS transistor Q1 is formed between a bit line BL and node Ni, and the gate electrode thereof is coupled to a word line WL. Also, the current path of the MOS transistor Q2 is formed between a bit line /BL and node N2, and the gate electrode thereof is coupled to a word line WL.

The logic level of the data at Node N1 is opposite to that at Node N2. When the MOS transistors Q1 and Q2 are turned on, the data at nodes N1 and N2 are transferred to the bit lines BL and /BL, respectively. This circuitry is called 4-transistor SRAM. A column shown in FIG. 1 includes sixteen memory cells MC1 to MC16 and this column can includes eight or thirty-two memory cells or more.

FIG. 2 is a block diagram illustrating the memory cell array and the periphery circuit to perform read and write operations in the conventional SRAM.

As shown in FIG. 2, the conventional SRAM includes a row decoder 11 for receiving address signals and selecting a word line in a memory cell array 10 having a plurality of memory cells. The signal outputted from the bit line in a memory cell array 10 is amplified by a sense amplifier circuit 12. A column decoder 13 receives column address signals inputted from input/output pins to apply the bit line selecting and decoded signals to the sense amplifier circuit 12. Also, the SRAM includes a read and write control circuit 14 for receiving the column address signals and the row address signals and performing read and write operations, an input buffer 15 for receiving data from an input terminal IN and controlling the sense amplifier circuit 12 in response to the output signal from the read and write control circuit 14, and an output buffer 16 for outputting output signals to an output terminal.

It should be noted that the memory cell array 10 may be applicable to dynamic RAMs as well as the SRAM stated above.

Referring again to FIG. 2, a specific memory cell is selected by combining column address signals with row address signals at the write operation. At this time, the data, which is inputted into the input buffer 15, is applied to a bit line selected by the column address signals, and then the data is stored in a memory cell corresponding to a word line selected by row address signals. During this writ operation, the output buffer 16 is turned off.

At the read operation, the input buffer 15 is turned off and the output buffer 16 is turned on. The word line is selected by the row decoder 11 and the bit line is selected by the column decoder 13. By doing so, if a memory cell is selected, the sense amplifier circuit 12 amplifies voltage difference between bit lines BL and /BL connected to the memory cell. The output buffer 16 drives the output voltage from the sense amplifier circuit 12. The detailed operation will be described below referring to FIG. 3.

FIG. 3 is a block diagram illustrating a circuit for reading and writing data in the memory cell coupled to a pair of bit lines. As shown in FIG. 3, NOMS transistors Q5 and Q6 are connected in series to bit lines BL and /BL and corresponding data lines DL and /DL so as to select a pair of bit lines. NOMS transistors Q7 and Q9 are connected in series to the bit line BL to perform the read and write operations, and also NOMS transistors Q8 and Q10 are connected in series to the bit line /BL to perform the read and write operations. The sense amplifier circuit 12 is connected to the data lines DL and /DL to amplify data which is read out from the data lines DL and /DL. The output buffer 16 is connected to the sense amplifier circuit 12. Further, a column selection signal Y1 for selecting a pair of bit lines is applied to the gate electrodes of NMOS transistors Q5 and Q6, and an enable signal WE is applied to the gate of the NOMS transistors Q7 and Q8 to perform the write operation. Data DATA and /DATA are applied to the gate of the NOMS transistors Q9 and Q10.

In FIG. 3, data DATA and /DATA are applied to the gate of the NOMS transistors Q9 and Q10 at the write operation. At this time, when the data DATA is at a high level, the NMOS transistor Q9 is turned on and the NMOS transistor Q10 is turned off. The bit lines BL and /BL is precharged by a precharge part 17, and the NMOS transistor Q7 and Q8 are turned on by the enable signal WE applied at a high level to the gates thereof. Also, the NMOS transistor Q5 and Q6 are turned on by the column selection signal Y1. For example, if the word line WL1 is selected, the pair of the bit lines BL and /BL are at a low level and a high levels, respectively, and the transfer MOS transistor Q1 and Q2 in FIG. 1 are turned on so that the voltage levels on the bit lines are respectively applied to gate electrodes of the transistors Q3 and Q4 in FIG. 1.

At the read operation, the enable signal WE is at a low level. Referring again to FIG. 1, after the pair of the bit lines BL and /BL is precharged by the precharge part 17, the word line WL1 is selected, and the transfer MOS transistors Q1 and Q2 are turned on and then, of data stored in the MOS transistors Q3 and Q4, the high level voltage is applied to the bit line BL and a low level voltage is applied to the bit line /BL.

Accordingly, the voltage level on the bit line BL is constant. However, the precharged voltage on the bit line /BL is decreased to a predetermined value. At this time, if the bit lines are selected by the input column address signals, for example, if the column signal Y1 is selected, the NMOS transistors Q5 and Q6 are turned on so that the voltage difference set up between the bit lines BL and BL is amplified by the sense amplifier circuit 12 and transferred to the output terminal.

Accordingly, the larger the size of the memory is, the more the consumption of power is. The power consumption is composed of the static power consumption and the dynamic power consumption and the power consumption at the read and write operations may be in proportion to the read and write frequency. When the read and write operations are not performed, data is maintained in the memory cell and only the static power consumption may occurs. However, the dynamic power consumption is inevitably generated at the read and write operations. Accordingly, it is very important to decrease the static power consumption generated at no operation. Therefore, in a system driven by potable battery, recent researches have concentrated their efforts upon the static power consumption.

SUMMARY OF THE INVENTION

An object of the present invention is to provide a memory device capable of decreasing the static power consumption.

Another object of the present invention is to provide a memory device suitable for a memory device driven by a potable battery.

In accordance with an aspect to the present invention, there is provided a semiconductor memory device comprising: a memory cell array including a plurality of N (integer, $N \geq 2$) cell array blocks, wherein the cell array blocks comprise a precharge means for providing a constant voltage for a pair of bit lines; and a voltage control means for diving a main supply voltage level Vdd applied to the device into N sub-voltage levels, wherein a voltage difference between a supply voltage level of each of the cell array blocks and a ground voltage level of each of the cell array blocks is $(1/N)*$ Vdd voltage.

In accordance with an aspect to the present invention, there is provided a method for applying voltage to a memory cell array in a semiconductor device, the method comprising the steps of: diving the memory cell array into a plurality of N (integer, $N \geq 2$) cell array blocks; and applying different voltage levels to the cell array blocks through a voltage divider, wherein a voltage difference between a supply voltage level of each of the cell array blocks and a ground voltage level of each of the cell array blocks is $(1/N)*$ Vdd voltage.

BRIEF DESCRIPTION OF THE DRAWINGS

Other objects and aspects of the invention will become apparent from the following description of embodiments with reference to the accompanying drawings, in which.

DETAILED DESCRIPTION OF THE PREFERRED EMBODIMENTS

Figure 4:
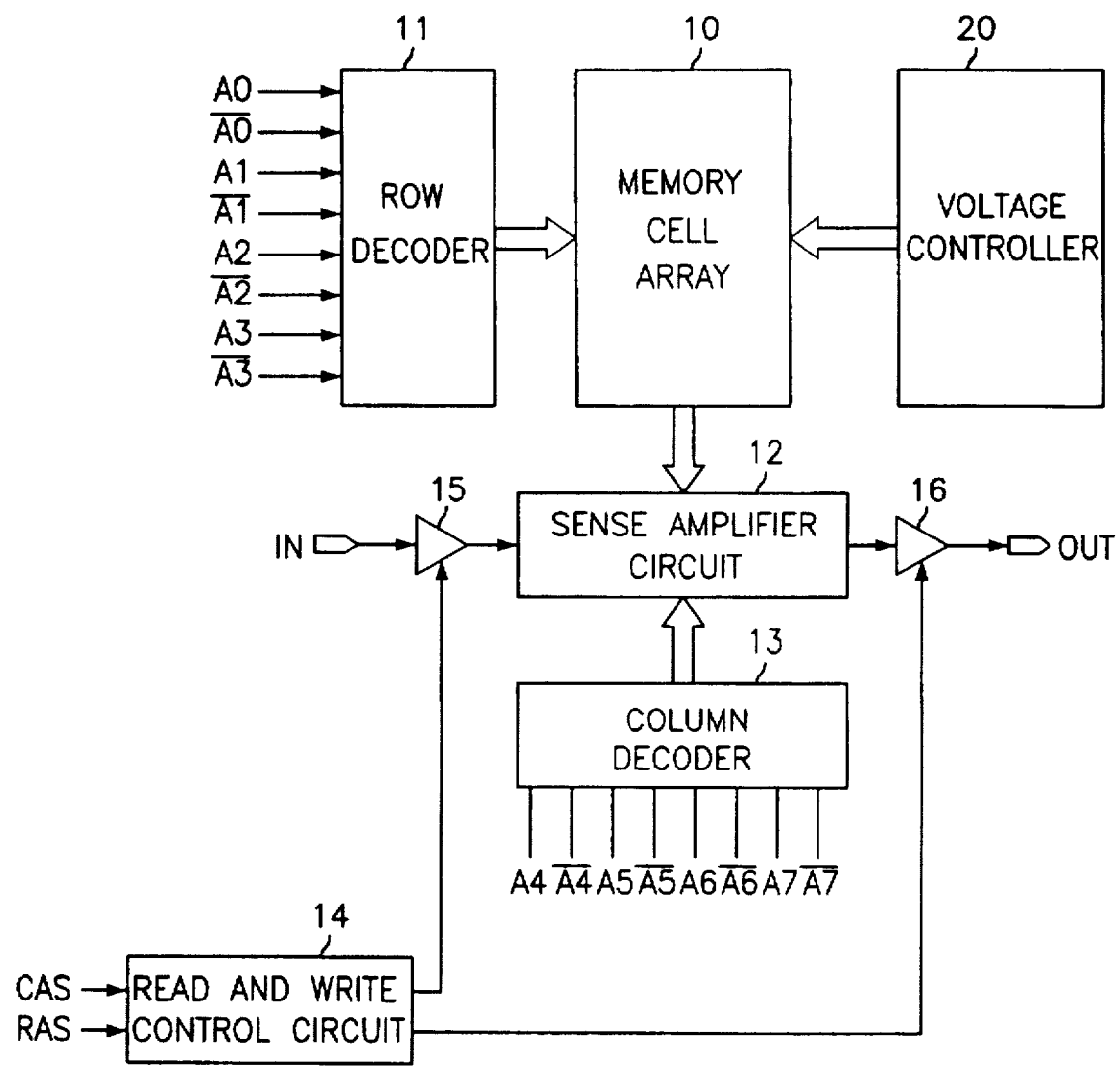
FIG. 4 is a block diagram illustrating a memory device in accordance with the present invention.

Hereinafter, the present invention will be described in detail refereeing to accompanying drawings. In FIGS. 4 to 6, the same elements are denoted as the same reference numerals.

Figure 1:
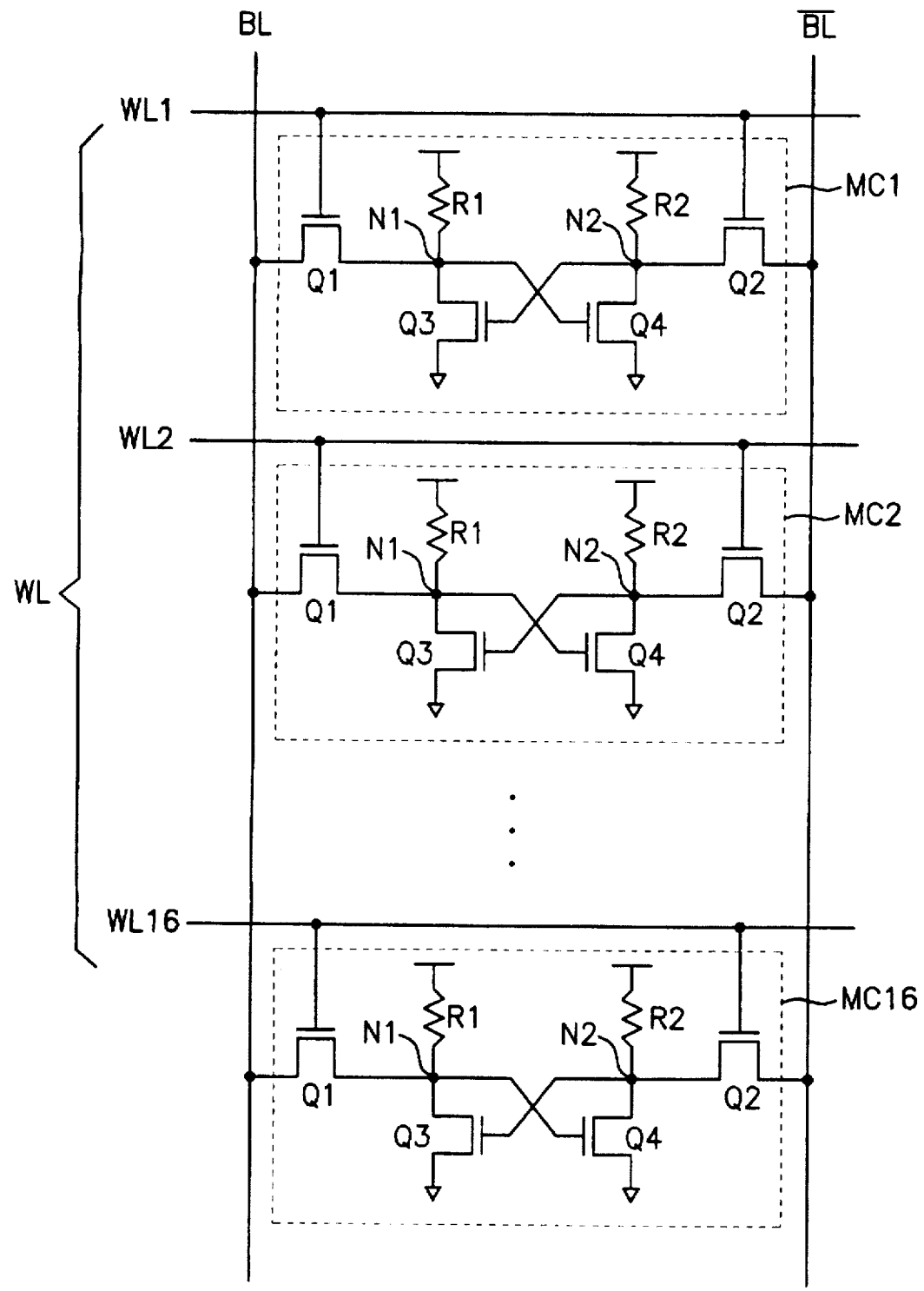
FIG. 1 is a block diagram illustrating the configuration of the conventional SRAM.
Figure 2:
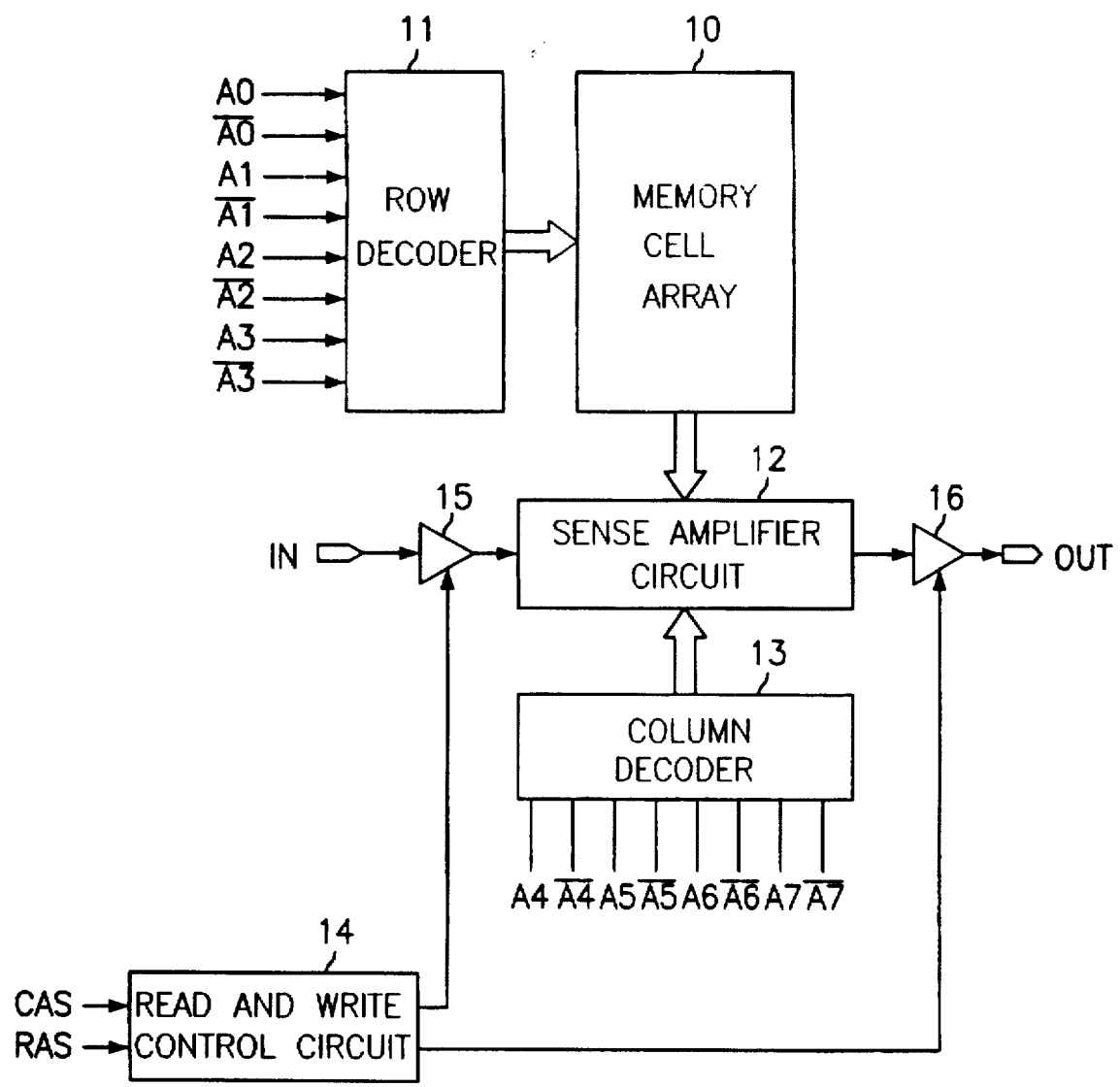
FIG. 2 is a block diagram illustrating the memory cell array and the periphery circuit to perform read and write operation in the conventional SRAM.
Figure 3:
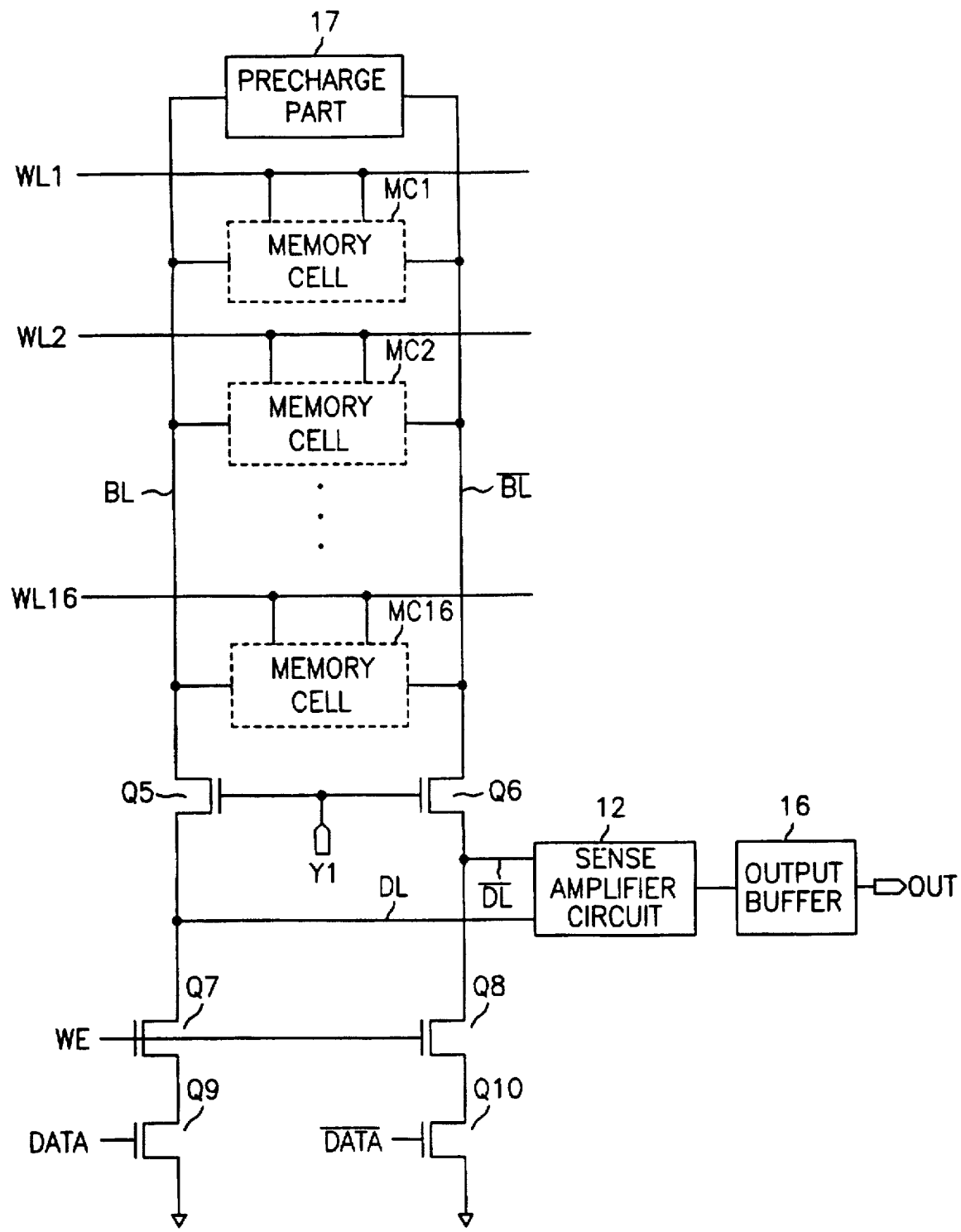
FIG. 3 is a block diagram illustrating a circuit fox reading and writing data in the memory cell coupled to a pair of bit lines.

FIG. 4 is a block diagram illustrating a memory device in accordance with the present invention. The memory device shown in FIG. 4 is divided into two cell array blocks, by dividing the memory cell array shown in FIG. 2 into a plurality of string units. That is, the memory cell array 10 is divided into two array blocks, the one of which operates at about 2.5 V to 5 V, the other of which operates at about 0 V to 2.5 V. It should be noted that the memory cell array 10 can be divided into three blocks or more and such array blocks may operate in a range of different voltage. The voltage applied to the memory cell array 10 is generated by the voltage controller 20. The operation and configuration will be described below.

In the case where the memory cell array 10 is divided into three array blocks, the first memory cell array block operates between the voltage power supply Vdd and the ground voltage $\frac{2}{3}$ Vdd, the second memory cell array block between the voltage power supply $\frac{2}{3}$ Vdd and the ground voltage $\frac{1}{3}$ Vdd, and the third memory cell array block operates between the voltage power supply $\frac{1}{3}$ Vdd and the ground voltage (0 V) of the memory cell array. The conception of these blocks will be described referring to FIGS. 5A and 5B.

Figure 5A:
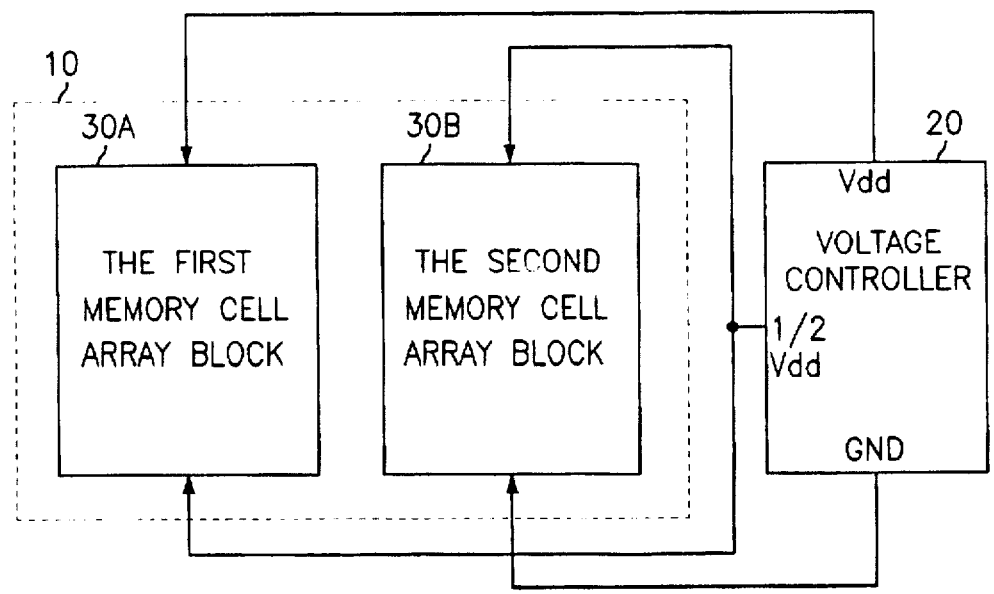
FIG. 5A and 5B are block diagrams illustrating the memory cell array divided into two and three array blocks in accordance with the present invention.
Figure 5B:
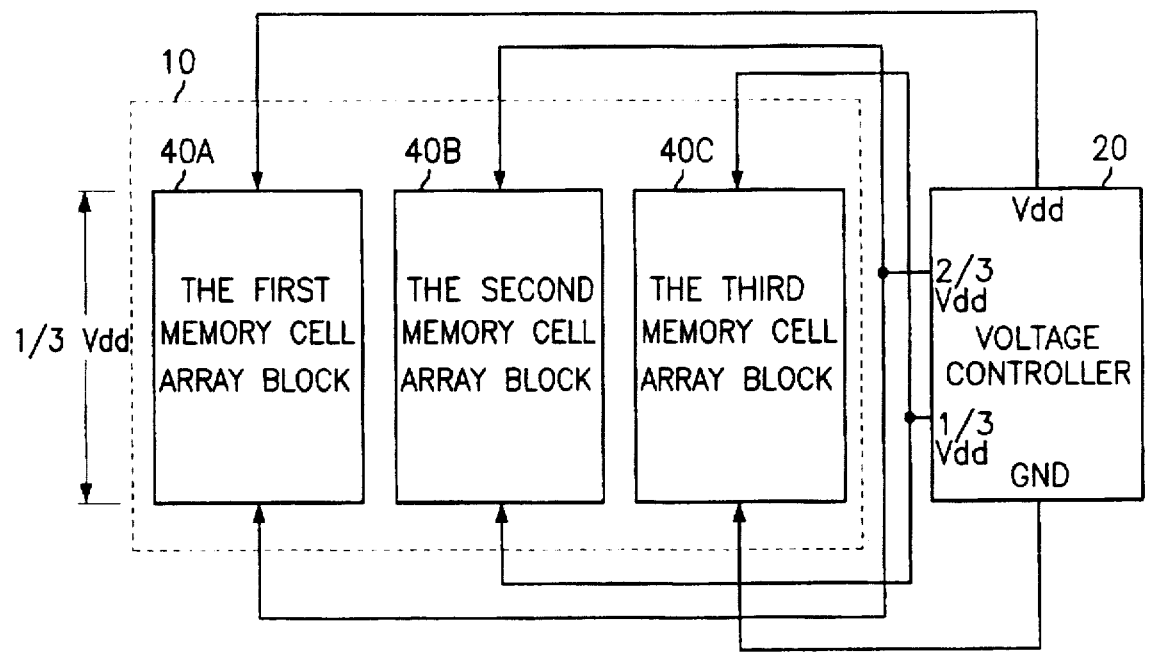
Figure 6:
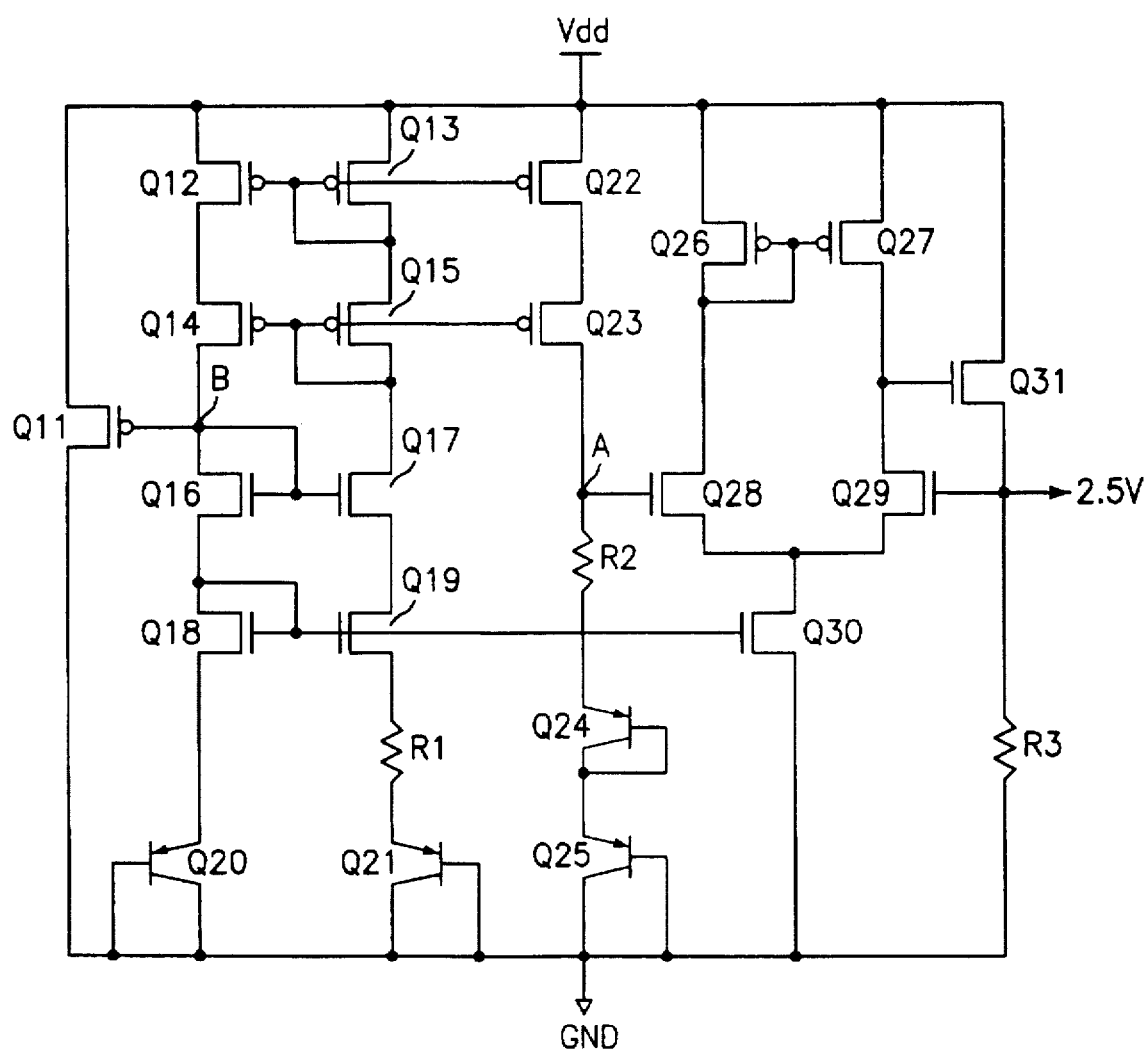
FIG. 6 is a diagram illustrating the voltage controller of FIG. 5A.

FIG. 5A and 5B are block diagrams illustrating the memory cell array divided into two and three array blocks in accordance with the present invention, respectively.

Referring to FIG. 5A, the memory cell array 10 is divided into two memory cell array blocks 30A and 30B and different voltages are applied to each of them. The first memory cell array block 30A is, coupled to the voltage power supply Vdd and the ground voltage supply ½ Vdd. Similarly, the second memory cell array block 30B is coupled to the voltage power supply ½ Vdd and a ground voltage supply which has a ground level of the memory cell array 10. By doing so, the current flowing in the first memory cell array block 30A is used in the second memory cell array block 30B. Accordingly, the static power consumption is cut down by half.

Referring to 5B, the memory cell array 10 is divided into three memory cell array blocks 40A to 40C in the same manner stated above, thereby cutting down its static power consumption by a third.

As a result, if the memory cell array 10 is divided into N(N:integer, $N \geq 2$) stages, the static power consumption is cut down by 1/N. This reduction of the static consumption may lengthen battery's span of life.

FIG. 6 is a diagram illustrating the voltage controller of FIG. 5A. In FIG. 6, PMOS transistors Q12 and QIS and NMOS transistors Q16 and Q19 constitute a current mirror circuit. Accordingly, the same current flows the emitters of bipolar transistors Q20 and Q21. To make the voltage of 2.5 V at connection point A, the middle level of voltage can be created by controlling resistivity of resistors R1 and R2. Transistors Q26 to Q31 constitute a buffer circuit. A PMOS transistor Q11 is turned on when the potential at the connection point B is 0 V, and the voltage controller operates with the increase of the potential at the connection point B.

On the other hand, in the case where the memory cell array is divided into three memory cell array blocks as shown in FIG. 5B, the voltage division is carried out by establishing resistors between the voltage output node and the ground level, generating the voltage levels, ⅔ Vdd and ⅓ Vdd.

As stated above, the present invention has effect on the reduction of the power consumption, thereby lengthening the potable battery's spans of life.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device comprising:

a memory cell array including a plurality of N (integer, N≧2) cell array blocks, wherein the cell array blocks comprise a precharge means for providing a constant voltage for a pair of bit lines; and a voltage control means for dividing a main supply voltage level vdd applied to the device into N subvoltage levels, wherein a voltage difference between a supply voltage level of each of the cell array blocks and a ground voltage level of each of the cell array blocks is (1/N)* Vdd voltage.

2. The semiconductor memory device in accordance with claim 1, wherein the constant voltage provided for the pair of bit lines is the same as the supply voltage level provided for the cell array block.

3. The semiconductor memory device in accordance with claim 1, wherein a supply voltage terminal of the cell array block is coupled to a ground voltage terminal of the another cell array block.

4. A method for applying voltage to a memory cell array in a semiconductor device, the method comprising the steps of:

dividing the memory cell array into a plurality of N (integer, N≧2) cell array blocks; and applying different voltage levels to the cell array blocks through a voltage divider, wherein a voltage difference between a supply voltage level of each of the cell array blocks and a ground voltage level of each of the cell array blocks is (1/N)* Vdd voltage.

5. The semiconductor memory device in accordance with claim 4, wherein the constant voltage provided for the pair of bit lines is the same as the supply voltage level provided for the cell array block.

6. The semiconductor memory device in accordance with claim 4, wherein a supply voltage terminal of the cell array block is coupled to a ground voltage terminal of the another cell array block.

* * * * *